United States Patent [19]

Papathomas

[11] Patent Number: 5,422,184
[45] Date of Patent: Jun. 6, 1995

[54] TRIFUNCTIONAL CYANATE ESTERS, POLYMERS THEREOF; USE AND PREPARATION THEREOF

[75] Inventor: Konstantinos I. Papathomas, Endicott, N.Y.

[73] Assignee: International Business Machines Corporation, Armonk, N.Y.

[21] Appl. No.: 197,814

[22] Filed: Feb. 18, 1994

Related U.S. Application Data

[62] Division of Ser. No. 996,904, Dec. 29, 1992, Pat. No. 5,292,861.

[51] Int. Cl.$^6$ .............................................. C08G 73/00
[52] U.S. Cl. ................................. 428/411.1; 428/426; 528/422; 528/423
[58] Field of Search ................ 528/422, 423; 428/426, 428/411.1

[56] References Cited

U.S. PATENT DOCUMENTS

| | | | |
|---|---|---|---|
| 3,553,244 | 1/1971 | Grigat | 560/443 |
| 3,763,115 | 10/1973 | Miller | 528/362 |
| 3,775,380 | 11/1973 | Miller | 528/423 |
| 3,839,306 | 10/1974 | Emerson et al. | 525/362 |
| 4,060,541 | 11/1977 | Sundermann | 560/301 |
| 4,116,946 | 9/1978 | Jakob | 528/422 |
| 4,216,316 | 8/1980 | Flagg | 544/193 |
| 4,499,245 | 2/1985 | Ikeguchi et al. | 525/417 |
| 4,555,565 | 11/1985 | Hsu | 528/322 |
| 4,612,359 | 9/1986 | Hefner, Jr. | 528/97 |
| 4,709,008 | 11/1987 | Shimp | 528/422 |
| 4,916,210 | 4/1990 | Jackson | 528/422 |
| 4,977,262 | 12/1990 | Herzlinger et al. | 544/221 |
| 4,981,994 | 1/1991 | Jackson | 560/301 |
| 5,068,309 | 11/1991 | Shimp | 560/301 |
| 5,152,939 | 10/1992 | Ishida | 528/153 |

FOREIGN PATENT DOCUMENTS

0252661A1 1/1988 European Pat. Off.
0366184A1 5/1990 European Pat. Off.

*Primary Examiner*—John C. Bleutge
*Assistant Examiner*—R. F. Johnson
*Attorney, Agent, or Firm*—Pollock, Vande Sande & Priddy

[57] ABSTRACT

Trisphenol PA tricyanate, prepolymers and crosslinked polymers thereof are provided. Blends of trifunctional cyanates and fluorinated or non-fluorinated difunctional cyanate are provided. The crosslinked polymers exhibit low dielectric loss properties and high glass transition temperatures and are suitable as the matrix material for structural composites including printed circuit boards.

8 Claims, No Drawings

TRIFUNCTIONAL CYANATE ESTERS, POLYMERS THEREOF; USE AND PREPARATION THEREOF

This is a divisional application of Ser. No. 07/996,904, filed on Dec. 29, 1992, now U.S. Pat. No. 5,292,861.

DESCRIPTION

Technical Field

The present invention is concerned with certain trifunctional cyanate esters which upon polymerization form polymers that exhibit relatively low dielectric constant, good thermal stability, good chemical resistance, relatively low coefficient of thermal expansion and relatively high glass transition temperature. More particularly, the present invention is concerned with trisphenol PA tricyanate and the synthesis thereof. In addition, the present invention is concerned with prepolymers and crosslinked triazine polymers obtained from the tricyanate. A still further aspect of the present invention is to provide compatible blends of fluorinated and nonfluorinated difunctional and trifunctional cyanates and prepolymers thereof. The prepolymers of the present invention when cured are especially suitable as the matrix material for structural composites including printed circuit boards having low dielectric properties.

Background Art

Circuit boards find a wide variety of uses in the electrical industry such as for radios, televisions, appliances, and various electrical apparatus. A widely employed technique for preparing circuit boards is to impregnate a woven fiberglass with a resin composition and then laminate a copper sheet to one or both sides of the resin impregnated fiberglass sheet. Next, an electrical circuit is etched into the copper to form the circuit board and then electrical connections can be soldered to the board when it is used.

Various resins have been suggested for the purpose of impregnating the fiberglass to prepare the circuit boards. For instance, polyimide resins have been used for such purpose. The use of the polyimide resins provides good quality circuit boards which possess high resistance to elevated temperatures, low thermal expansion, and good electrical properties including high electrical resistivity. However, circuit boards prepared from polyimide resins are relatively expensive when compared to circuit boards prepared from epoxy resin impregnated fiberglass sheets.

Circuit boards of epoxy resin impregnated fiberglass sheets, although much less expensive than those prepared using polyimide resins, are not especially resistant to high temperatures, have reduced electrical properties and higher thermal expansion when compared to circuit boards of polyimide resin impregnated fiberglass sheets. In addition, other types of resin systems have been suggested for this purpose. For instance, a combination of certain epoxy resins and certain specific bismaleimide materials are suggested in U.S. Pat. Nos. 4,294,877 and 4,294,743.

Moreover, bismaleimide triazine polymeric materials have been suggested as a possible binder or matrix material for printed circuit boards. However, such materials do not form a stable solution in various low boiling point solvents. It is desirable to use low boiling solvents to assist in the rapid application of the resin when attempting to employ such for the purposes of preparing printed circuit boards. One suggestion to prevent such resins from coming out of the solution is to include a solvent such as dimethyl formamide or N-methyl pyrrolidone. Along these lines, see page 11 of High Heat Resistant Polymide Resin BT Resin Bismaleimide Triazine (the third edition), Mitsubishi Gas Chemical Company, Inc.

More recently, compositions suitable for making circuit boards containing a bismaleimide triazine polymer, a brominated epoxy, and a solvent have been described in U.S. Pat. No. 4,456,712 to Christie et al.

Resin compositions, when cured, should desirably exhibit a relatively high glass transition temperature and possess high resistance to elevated temperatures. Accordingly, compositions to be suitable as the matrix material for integrated circuit boards must possess a number of diverse characteristics including relatively high glass transition temperature when cured, solubility and stability in low boiling point solvents, adhesion to the fiberglass sheets, low thermal expansion, and high electrical resistivity.

SUMMARY OF INVENTION

The present invention is concerned with trisphenol PA tricyanate, and the synthesis thereof. The trisphenol PA tricyanate is prepared by reacting trisphenol PA and a cyanogen halide in the presence of a base.

The present invention is also concerned with prepolymers of the trisphenol PA tricyanate.

The present invention is also concerned with crosslinked polymers obtained from curing the prepolymers.

The present invention is also concerned with mixtures of fluorinated and nonfluorinated difunctional cyanates and trifunctional cyanates either in the monomeric or prepolymeric state.

The crosslinked polymers exhibit low dielectric loss properties, high glass transition temperatures and good mechanical properties.

A still further aspect of the present invention is concerned with a fibrous substrate impregnated with the above desired prepolymers or blends. Moreover, the present invention is concerned with a product of a fibrous substrate wherein the impregnated with the prepolymer wherein the prepolymer is cured to a crosslinked polymer.

BEST AND VARIOUS MODES FOR CARRYING OUT THE INVENTION

The present invention is concerned with trisphenol PA tricyanate which can be represented by the formula:

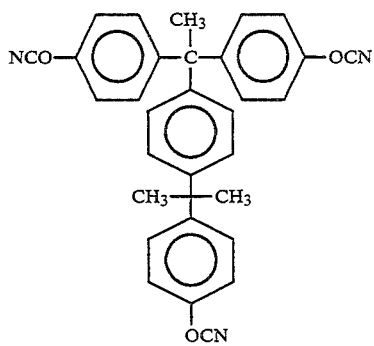

The trisphenol PA tricyanate is a solid material and has a melting point of about 132° C. as measured by Differential Scanning Colorimetry.

The trisphenol PA tricyanate of the present invention is synthesized by reacting a cyanogen halide with trisphenol PA in the presence of an acid acceptor i.e. base.

Suitable cyanogen halides include cyanogen bromide and cyanogen chloride. Alternately, the method of Martin and Bauer described in Organic Synthesis, Volume 61, pp. 35-68 (1983) published by John Wiley and Sons, can be used to generate the required cyanogen halide in situ from sodium cyanide and or halogen such as chlorine or bromine.

The reaction of the cyanogen halide with a phenol is catalyzed by a base. The base can be, for example, an alkali metal hydroxide, such as sodium hydroxide, or potassium hydroxide; an alkali metal alkylate such as sodium methylate or potassium metylate; and various amines, preferably tertiary amines.

The basic catalyst is preferably a tertiary amine. Tertiary amines can be represented by the formula

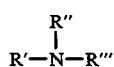

in which R', R", and R''' represent $C_{1-36}$, preferably $C_{1-10}$ alkyl; and such as phenyl; and $C_4$ cycloalkyl. Examples of such tertiary amines include trimethyl amine, triethyl amine, methyl diethyl amine, tripropyl amine, tributyl amine, methyl dibutyl amine, dinonyl methyl amine, dimethyl stearyl amine, dimethyl cyclohexyl amine and diethyl aniline. The preferred tertiary amine, due to its catalytic activity is triethylamine.

Suitable solvents include water, acetone, chlorinated hydrocarbons, ketones and the like. Most preferred solvents are acetone and methylene chloride. Reaction temperatures of from about −30° C. to about 50° C. are suitable with temperatures of −20° to about 25° C. being preferred.

The prepolymers of the present invention can be prepared by heating the trisphenol PA tricyanate above its melting point in the presence or absence of a catalyst.

Examples of the catalysts include organic metal salts, such as lead naphthenate, lead stearate, zinc naphthenate, zinc octoate, tin oleate, dibutyl tin maleate, manganese naphthenate, cobalt naphthenate, and acetyl acetone iron; and inorganic metal salts, such as stannic chloride; zinc chloride and aluminum chloride.

The amount of catalyst employed is typically about 0.001 to about 5% by weight and more typically about 0.01 to about 0.2% weight based upon the cyanate ester.

Formation of the prepolymer is typically carried out at temperatures of about 150° C. to about 200° C. and more typically about 180° C. to about 200° C.

The prepolymerization is carried out until up to about 50%, preferably about 5 to about 50%, and most preferably about 5 to about 30% of the —OCN functional groups of the cyanate ester are trimerized; which typically takes about 60 to about 90 minutes. The polymerization is terminated by cooling to room temperature.

The prepolymers of the present invention are soluble in tetrahydrofuran and ketones such as methyl ethyl ketone and are preferably employed in the form of compositions containing an organic solvent. The solvent is preferably a low boiling point solvent and most preferably is a ketone such as methyl ethyl ketone. In the preferred aspects of the present invention, the solvent is substantially free, if not entirely free, from solvents other than ketones. The solvent is present in amounts of about 10 to about 70% by weight based upon the total weight of the prepolymer and the solvent present in the composition.

In addition, the present invention provides triazine polymers that are especially suitable as the matrix resins for structural composites and printed circuit boards. Such triazine polymers are reaction products of (a) the trisphenol PA tricyanate of the present invention and/or prepolymer thereof; and (b) a difunctional cyanate, and/or prepolymer thereof. Suitable difunctional cyanates are represented by the formula:

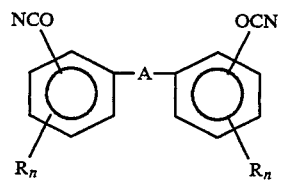

wherein A represents independently a single bond,

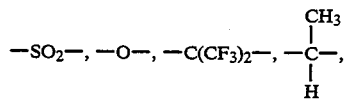

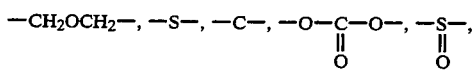

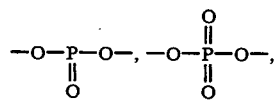

—SO₂—, —O—, —C(CF₃)₂—, divalent alkylene radicals such as —CH₂— and —C(CH₃)₂—; divalent alkylene radicals interrupted by heteroatoms in the chain such as O, S and N.

Each R is independently selected from the group of hydrogen and alkyl containing 1-9 carbon atoms.

Each n independently is an integer of 0 to 4. Other polyfunctional cyanates are prepared by well known methods, for example, by reacting the corresponding polyvalent phenol with a halogenated cyanate as exemplified in U.S. Pat. Nos. 3,553,244, 3,740,348 and 3,755,402.

Examples of difunctional cyanate ester include: 1,3- or 1,4-dicyanatobenzene; 1,3,5-tricyanatobenzene, 1,3-, 1,4-, 1,6-, 1,8-, 2,6-, or 2,7-dicyanatonaphthalene, 1,3,6-tricyanatonaphthalene; 4,4'-dicyanatobiphenyl, bis(4-cyanatophenyl) methane; 2,2-bis(4-cyanatophenyl) propane, 2,2-bis(3,5-dichloro-4-cyanatophenyl)-propane; bis(4-cyanatophenyl) ether; bis(4-cyanatophenyl)-thioether, bis(4-cyanatophenyl) sulfate; tris(4-cyanatophenyl) phosphite; tris(4-cyanatophenyl) phosphate; bis(3-chloro-4-cyanatophenyl) methane; cyanated novolak derived from novolak, cyanated bisphenol type polycarbonate oligomer derived from bisphenol type polycarbonate oligomer, and mixtures thereof. Other cyanate esters employed in the practice of this invention are listed in U.S. Pat. Nos. 3,553,244; 3,740,348; 3,755,402; 3,562,214; British Patent No. 1,060,933; Japanese Patent Publication (Kohkoku) Nos. 18458/1968; British Patent Nos. 1,218,447 and 1,246,747 and U.S. Pat. No. 3,994,929 and Japanese Patent Publication (Kohkai) No. 26853/1972 which are incorporated herein by reference.

Specific cyanate esters that can be employed in the present invention are available and well-known and include those discussed in U.S. Pat. Nos. 4,195,132; 3,681,292; 4,740,584; 4,745,215; 4,477,629; and 4,546,131; European patent application EP0147548/82; and German Offen. 2611796, disclosures of which are incorporated herein by reference.

An example of a suitable polyaromatic cyanate ester containing cycloaliphatic bridging group between aromatic rings is available from Dow Chemical Company under the designation "Dow XU-71787 cyanate. A discussion of such can be found in Bogan, et al., "Unique Polyaromatic Cyanate Ester for Low Dielectric Printer Circuit Board," Sampe Journal, Vol. 24, No. 6, Nov/Dec 1988. Specific difunctional cyanate ester is bisphenol AD dicyanate (1,1'-ethylidene bisphenol dicyanate, Arocy-L10) hexafluoro bisphenol A dicyanate (Arocy-40S) and bisphenol M dicyanate (RTX-366) commercially available from Ciba-Geigy.

When prepolymers of the dicyanate are employed such typically have conversions of up to about 40% and more typically of up to about 30%.

The amount of the dicyanate and/or prepolymer thereof is correspondingly about 5 to about 95% by weight, preferably about 10 to about 90% by weight and most preferably about 10 to 80% by weight of this total of the trifunctional and difunctional cyanate and/or prepolymers thereof.

In addition, just prior to use, a catalyst is generally added to the compositions of the present invention to facilitate curing of the compositions. Examples of suitable catalysts include metal salts of carboxylic acids such as salts of octanoic acid, stearic acid and naphthenic acid, including zinc octoate, stannic octoate, zinc naphthenate and cobalt naphthenate; metallic salts of acetylacetone such as ferricacetylacetonate and copper acetylacetonate and chlorides such as stannic chloride, aluminum chloride, ferric chloride and ferrous chloride.

Other catalysts include phenol and other organometallics such as chelates of iron, cobalt, zinc, copper and manganese. The preferred catalyst is zinc octoate. Such catalysts are used in amounts of about 0.001 to about 2.0 parts by weight per 100 parts by weight of the prepolymer.

The compositions of this invention can be cured by heating a temperatures of about 250° C. to about 300° C. for sufficient time to produce fully cured products where all —OCN functional groups are reacted, which typically takes about 1 to about 3 hours. The cured polymers of the present invention are highly crosslinked and thermosetting. Such exhibit low dielectric constant, excellent thermal stability, good chemical resistance, relatively low coefficient of thermal expansion (CTE), high glass transition temperature ($T_g$), and good mechanical properties.

The cured compositions are particularly useful in circuit boards and structural composites, molded encapsulants, and high temperature adhesives and coatings.

The compositions of the present invention are preferably employed to prepare printed circuit boards. In preparing the boards, a fibrous substrate is coated and impregnated with the prepolymer of the present invention. Conventional coating equipment can be employed. Subsequent to coating, the impregnated substrate is B-staged at a temperature of about 130° to about 150° C. for about 2 to about 5 min. to form a rigid non tacky substrate. The compositions can be used to coat and/or impregnate fibrous substrates such as fiberglass, polyimides, graphite, PTFE and the like.

After the rigid non tacky substrate is formed, a sheet of copper or other conductive material can then be laminated to the rigid substrate using laminating conditions such as pressures of about 50 to about 400 pound per square inch and temperatures of about 250° to 300° C. applied for about 90 to about 180 minutes. Then a circuit can be etched into the conductive layer using techniques well-known to form circuit board.

The following non-limiting examples are presented to further illustrate the present invention.

EXAMPLE 1

Trisphenol PA (42.4 grams 0.1 mol) and about 500 ml of acetone are combined in a one liter 3-necked round-bottom flask equipped with a low-temperature thermometer, an addition funnel and a mechanical stirrer. About 3 grams (0.3 mol) cyanogen bromide are added all at once and the resulting clear solution is cooled to −5° to −10° C. in an ice bath. About 30.3 grams (0.3 mols) of triethylamine are added dropwise at such a rate that the temperature of the reaction mixture does not rise above about −5° C. After the addition of triethylamine is completed, stirring is continued for about 30 min; the reaction mixture is then poured into ice water, with magnetic stirring. The desired cyanate is precipitated and is removed by filtration, washed with water and dried.

Upon recrystalization in acetone/dichloromethane, the tricyanate gradually polymerizes to a jelly-like material. A sample of-about 6 g (13%) of pure trisphenol PA tricyanate is obtained. The resulting solid trisphenol PA tricyanate has a melting point of about 132° C. as measured by Differential Scanning Colorimetry.

The monomers are catalyzed with about 100 ppm zinc metal in the form of zinc octanoate by dissolving in methyl ethyl ketone or tetrahydrofuran to provide a prepolymer. The prepolymer is then heated to about 300° C. for about 2 hours to provide the cured crosslinked polymer. A glass transition temperature of greater than 290° C. is obtained.

EXAMPLE 2

A composition containing about 10 parts of trisphenol PA tricyanate, 10 parts of bisphenol M dicyanate and 80 parts of hexafluorobisphenol A dicyanate both supplied by Ciba-Geigy are dissolved in about 40 parts of methyl ethyl ketone and catalyzed with about 0.2 parts of zinc octoate (8% zinc metal) in mineral spirits, is prepared.

The mixture is well mixed and then allowed to air dry for a few days then vacuum dried at about 50° C. for 24 hours. A catalyzed homogeneous mixture is obtained which is then analyzed using Differential Scanning Colorimetry heating the sample from room temperature to 320° C. at 20° C./min heating rate twice. The glass transition temperature of this composition was found to be in the range of about 280° C. and the coefficient of thermal expansion in the range of 50–55 ppm/°C. (0°–100° C. limits). A UL94-VO rating is obtained on resin castings made from this composition.

EXAMPLE 3

A composition containing about 20 parts of trisphenol PA tricyanate and 80 parts of hexafluorobisphenol A dicyanate supplied by Ciba-Geigy are dissolved in about 35 parts of methyl ethyl ketone and catalyzed with about 0.2 parts of zinc octoate (8% zinc metal) in mineral spirits, is prepared.

The mixture is mixed and then allowed to air dry for a few days then vacuum dried at about 50° C. for 24 hours. A catalyzed homogeneous mixture is obtained which is then analyzed using Differential Scanning Colorimetry heating the sample from room temperature to 320° C. at 20° C./min heating rate twice. The glass transition temperature of this composition was found to be in the range of about 300° C. and the coefficient of thermal expansion in the range of 45-50 ppm/°C. (0°-100° C. limits).

EXAMPLE 4

A composition containing about 30 parts of trisphenol PA tricyanate and 70 parts of AROCY-40S (70% solids in methyl ethyl ketone) supplied by Ciba-Geigy are catalyzed with about 0.2 parts of zinc octoate (8% zinc metal) in mineral spirits, is prepared.

The mixture is mixed and then allowed to air dry for a few days then vacuum dried at about 50° C. for 24 hours. A catalyzed homogeneous mixture is obtained which is then analyzed using Differential Scanning Colorimetry heating the sample from room temperature to 320° C. at 20° C./min heating rate twice. The glass transition temperature of this composition was found to be in the range of about 290° C. and the coefficient of thermal expansion in the range of 50 ppm/°C. (0°-100° C. limits).

What is claimed is:

1. A product comprising a fibrous substrate impregnated with a composition containing a prepolymer of trisphenol PA tricyanate wherein about 5 to about 50 percent of the —OCN functional groups are trimerized is cured.

2. The product of claim 1 wherein said prepolymer is cured to a crosslinked polymer.

3. The product of claim 1 wherein about 5 to about 30 percent of the —OCN functional groups are trimerized.

4. The product of claim 1 wherein about 5 to about 20 percent of the —OCN functional groups are trimerized.

5. The product of claim 1 wherein said composition contains a catalyst.

6. The product of claim 2 wherein said crosslinked polymer has a glass transition temperature of at least about 250° C.

7. A triazine polymer being the reaction product of
   a) trisphenol PA tricyanate, prepolymer thereof or mixtures thereof; and
   b) difunctional cyanate, prepolymer thereof; wherein the amount of (a) is about 5 to about 95% by weight and the amount of (b) is correspondingly about 95% to about 5% by weight based upon the total of (a) and (b).

8. The triazine polymer of claim 7 wherein said dicyanate is selected from the group consisting of bisphenol AD dicyanate, hexafluorobisphenol A dicyanate, bisphenol M dicyanate and mixtures thereof.

* * * * *